United States Patent [19]

Tsugaru et al.

[11] Patent Number: 4,788,459
[45] Date of Patent: Nov. 29, 1988

[54] BI-CMOS VOLTAGE LEVEL CONVERSION CIRCUIT

[75] Inventors: Kazunori Tsugaru; Yasuhiro Sugimoto, both of Yokohama, Japan

[73] Assignee: Kabushiki Kaisha Toshiba, Kawasaki, Japan

[21] Appl. No.: 24,164

[22] Filed: Mar. 10, 1987

[30] Foreign Application Priority Data

Mar. 31, 1986 [JP] Japan ................................. 61-72905

[51] Int. Cl.$^4$ .................. H03K 19/092; H03K 17/16; H03K 19/02; H03K 17/60
[52] U.S. Cl. ................................... 307/475; 307/443; 307/446; 307/570
[58] Field of Search ............... 307/570, 443, 446, 475, 307/384

[56] References Cited

U.S. PATENT DOCUMENTS 4,176,272 11/1979 Powers ................................ 307/570
4,437,171 3/1984 Hudson et al. ...................... 365/177
4,453,095 6/1984 Wrathall ............................ 307/475

FOREIGN PATENT DOCUMENTS 0068883 1/1983 European Pat. Off. .

OTHER PUBLICATIONS

D. A. Hodges et al., "Interfacing," Analysis and Design of Digital Integrated Circuits, Chap. 7, Sec. 7, 1983.

Primary Examiner—John S. Heyman
Assistant Examiner—M. R. Wambach
Attorney, Agent, or Firm—Finnegan, Henderson, Farabow, Garrett and Dunner

[57] ABSTRACT

In the output circuit a signal from an internal circuit is supplied to the gate of an N-channel type MOS transistor, a node of two resistors connected in series across a power supply terminal and ground is connected to one end of the MOS transistor. An NPN transistor is connected at its base to the node, at its collector to the power supply terminal and at its emitter to an output terminal. The positive polarity terminal of a power supply is connected to the power supply terminal to supply a positive voltage $V_{CC}$ and the negative polarity terminal of another power supply is connected through a load resistor to the output terminal to supply a negative voltage.

7 Claims, 2 Drawing Sheets

BI-CMOS VOLTAGE LEVEL CONVERSION CIRCUIT

BACKGROUND OF THE INVENTION

This invention relates to a voltage output circuit comprising a semiconductor circuit including MOS (Metal Oxide Semiconductor) and bipolar devices for converting a CMOS (Complementary MOS) or a TTL (Transistor Transistor Logic) level voltage signal to an ECL (Emitter Coupled Logic) level voltage signal and for outputting the ECL level voltage signal.

TTL-ECL output circuits of the type described above are known. Examples of such circuits include MC10124 to MC10191 TTL-ECL output circuits, of Motorola Inc. (MECL 10K series) are known in the art. The known output circuits, however, require both a positive power supply (for example, +5 volts) for driving a CMOS circuit or a TTL circuit and a negative power supply (for example, −5.2 V) for driving an ECL circuit. This is not desirable from the standpoint of cost. Furthermore, owing to the use of the positive and negative power supplies, elements in these known circuits are required to have a breakdown voltage high enough for the sum of both the power supply voltages. Where one of these known output circuits and another circuit are formed on a common chip, each of these circuits is also required to have a breakdown voltage high enough for the sum of both the power supply voltages.

In summary, conventional output circuits for converting a CMOS or a TTL level voltage signal to an ECL level voltage signal require both the positive and negative power supplies and, furthermore, when they are formed, together with another circuit, the latter circuit is also required to have a breakdown voltage high enough for the aforementioned sum voltages.

SUMMARY OF THE INVENTION

It is accordingly the object of this invention to provide a voltage output circuit comprising a semiconductor integrated circuit including MOS and bipolar type elements, which operates with only one power supply and can provide an ECL level voltage output.

According to this invention a voltage output circuit is provided which comprises:

a bipolar transistor connected at its collector to a power supply terminal and at its emitter to an output terminal;

a bias circuit for setting a base voltage of said bipolar transistor;

a MOS transistor for determining, based on a signal from an internal circuit, whether or not a bias voltage output from the bias circuit should be applied to the base of the bipolar transistor, and a negative power supply connected to the output terminal whereby an ECL level output is obtained.

PREFERRED EMBODIMENT OF THE INVENTION

Figure 1:
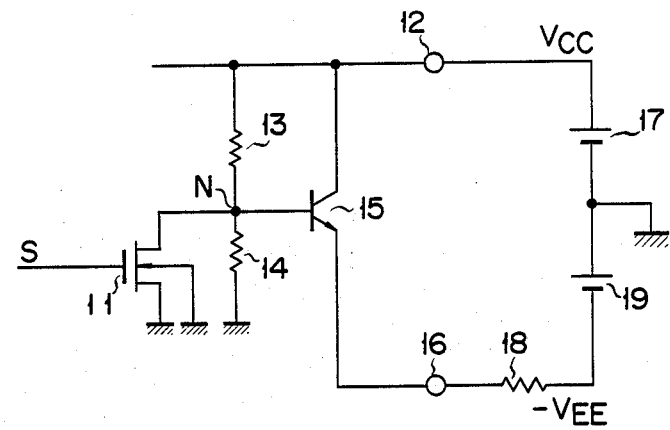
FIG. 1 is a basic circuit diagram showing a voltage output circuit according to this invention.

The fundamental arrangement of a voltage output circuit according to this invention is as shown in FIG. 1. A signal S from an internal circuit is supplied to the gate of N-channel type MOS transistor 11. One end of MOS transistor 11 is connected to a node N of resistors 13 and 14 in a series array between power supply terminal 12 and ground and the other end and back gate of MOS transistor 11 are grounded. NPN type bipolar transistor 15 is connected at its base to the node N, at its collector to power supply terminal 12 and at its emitter to output terminal 16. The positive polarity terminal of power supply 17 is connected to power supply terminal 12 where a positive voltage $V_{CC}$ is supplied by power supply 17. The negative polarity terminal of power supply 19 is connected through load resistor 18 to output terminal 16 where a negative voltage $-V_{EE}$ is supplied by power supply 19. The negative polarity terminal of power supply 17 and positive polarity terminal of power supply 19 are grounded.

The operation of the voltage output circuit shown in FIG. 1 will be explained below.

When the signal S is at a high level, then MOS transistor 11 is turned ON. When the signal S is at a low level, then MOS transistor 11 is turned OFF. With the resistive values of resistors 13 and 14 represented by R13 and R14, respectively, a voltage on the node N is shifted between $$\frac{R14 \cdot V_{CC}}{R13 + R14}$$

and the ground by operating MOS transistor 11 in an ON/OFF fashion in accordance with a signal S coming from the internal circuit. Specifically, when transistor 11 is turned OFF by the signal S, a base voltage on NPN transistor 15 becomes approximately $$\frac{R14 \cdot V_{CC}}{R13 + R14}$$

when transistor 11 is turned ON, a base voltage of NPN transistor 15 becomes the ground voltage. Thus a voltage on output terminal 16 is shifted between $$\frac{R14 \cdot V_{CC}}{R13 + R14} - V_{BE15}$$

and $-V_{BE15}$. Where $V_{BE15}$ denotes a base-emitter voltage of NPN transistor 15. From the above description, it is clear then, that, output circuit of FIG. 1 produces a small negative output while operating with a positive power supply alone. The circuit elements in the above-described output circuit require the breakdown voltage only for the positive power supply voltage $V_{CC}$.

An embodiment of the output voltage circuit of this invention will be explained below with reference to FIGS. 2 and 3. The same reference characters used in FIGS. 1 and 2 denote the same components.

A CMOS level signal S from the internal circuit is supplied to the gate of an N-channel type MOS transistor 11. MOS transistor 11 is connected at one end to the base of NPN type bipolar transistor 15 and grounded at the other end and back gate. Transistor 15 is connected at its collector to power supply terminal 12 and at its base to a node N. A resistor 13 is connected across the base and the collector of transistor 15. A series circuit of resistors $14_1$ and $14_2$ is connected across the base of transistor 15 and ground. A node of resistors $14_1$ and $14_2$ in series connection is connected to the base of NPN type bipolar transistor 21 which is connected between the base of transistor 15 and ground. Transistor 15 is connected at its emitter to the base of NPN type bipolar transistor 22 and to one end of resistor 23. Transistor 22 is connected at its collector to power supply terminal 12 and at its emitter to one end of each of resistors 24 and 25. Output terminal 16 is connected to the other end of each of resistors 23 and 24. NPN type bipolar transistor 26 is connected at its base to the other end of resistor 25, at its emitter to output terminal. The collector of NPN type bipolar transistor 26 is grounded. A combination of transistors 22 and 26 is connected to transistor 15 in a Darlington configuration. An electric current flowing through transistors 22 and 26 is supplied to output terminal 16. Diode 27 is connected across output terminal 16 and ground with the anode connected to output terminal 16 and the cathode grounded. A positive voltage $V_{CC}$ is supplied from power supply 17 to power supply terminal 12 and a negative voltage $-V_{EE}$ is applied from power supply 19 through load resistor 18 to output terminal 16. The negative polarity terminal of power supply 17 and positive polarity terminal of power supply 19 are grounded. Resistor 25 is used for waveform rectification and diode 27 is used for surge voltage protection.

The operation of the aforementioned circuit will now be explained below.

With R1 and R2 representing the resistive values of resistors $14_1$ and $14_2$, respectively, when transistor 11 is turned OFF, a base voltage on NPN transistor 15 becomes approximately $$(R1+R2)V_{BE}/R2,$$

which is made constant irrespective of the power supply voltage $V_{CC}$. $V_{BE}$ denotes a base-emitter voltage of NPN transistor 15. When transistor 11 is turned ON, a base voltage on NPN transistor 15 becomes the ground voltage. In other words, that base voltage undergoes a transient shift between the ground voltage and the voltage $$(R1+R2)V_{BE}/R2$$

in accordance with the ON or the OFF state of MOS transistor 11.

Let it be assumed that the signal S from the internal circuit is at a high level. Then MOS transistor 11 is turned ON and thus the base voltage of transistor 15 becomes grounded. This voltage level is dropped across respective base-to-emitter paths of transistors 15, 22 and 26 so that a small negative voltage $-3\ V_{BE}$ appears from output terminal 16. $V_{BE}$ denotes a base-emitter voltage of each of the transistors 15, 22 and 26.

With the signal S at a low level, MOS transistor 11 is turned OFF and the base voltage on transistor 15 becomes:

$$(R1+R2)V_{BE}/R2$$

This voltage is dropped across the base-to-emitter paths of transistors 15, 22 and 26 so that a small voltage $$(R1+R2)V_{BE}/R2 - 3\ V_{BE}$$

emerges from output terminal 16.

Figure 2:
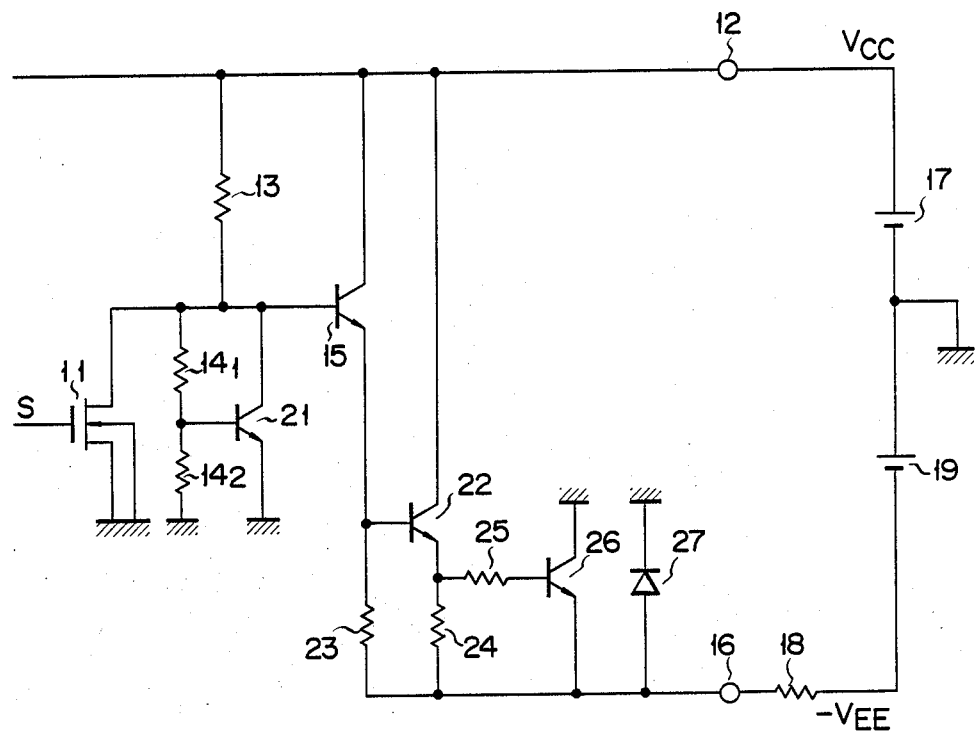
FIG. 2 is a circuit diagram of a voltage output circuit according to an embodiment of the present invention.

In the voltage output circuit of FIG. 2, NPN transistors 15, 22 and 26 are used to produce an output voltage of an ECL level. Base-emitter voltage $V_{BE}$ of a bipolar transistor decreases as an ambient temperature increases. In the output circuit, the base voltage of NPN transistor 15 drops by a total value, $-3\ V_{BE}$, of NPN transistors 15, 22 and 26, rendering the output voltage on output terminal 16 small. The bias circuit comprising resistors $14_1$ and $14_2$ and NPN transistor 21 is used to increase the base voltage of NPN transistor 15 so that, for the temperature variation, the output voltage on output terminal 16 is compensated.

Figure 3:
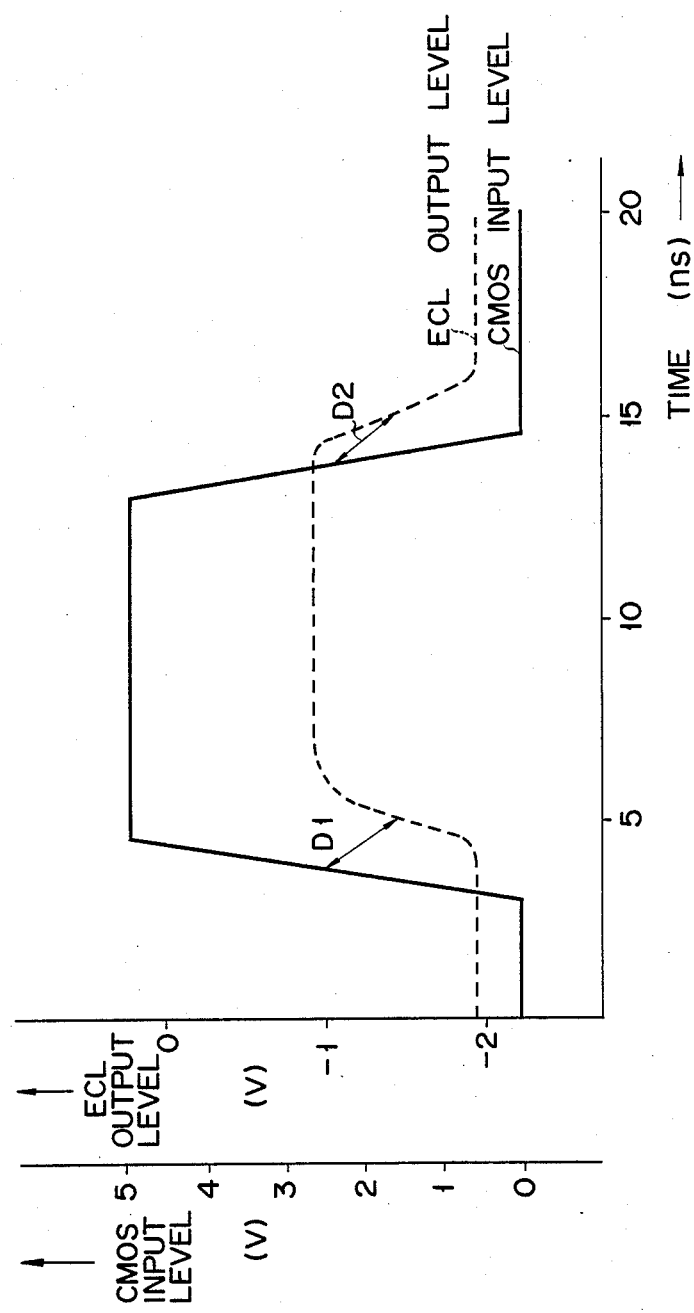
FIG. 3 is a characteristic curve showing a relation of a CMOS input level and ECL output level with respect to time, of the voltage output circuit of FIG. 2.

FIG. 3 shows the result of simulation performed on the CMOS level input and ECL output level characteristics of the circuit of FIG. 2 through the use of an SPICE simulation program, noting that $V_{CC}=5$ V, $-V_{EE}=-2$ V, $R18=50\Omega$ and the signal S is a pulse signal whose rise and fall times are 1.5 ns each and which varies between 0 V and 5 V.

As understood from FIG. 3, the voltage output circuit of FIG. 2 operates with a single power supply and converts the CMOS level voltage signal to the ECLL level voltage output. A very high speed is achieved for the conversion times D1 and D2 of about 1.3 ns in comparison with that (about 5 to 6 ns) of the conventional circuit.

As set forth above, according to this invention a semiconductor output circuit including MOS and bipolar elements is provided, which operates with the use of only one positive power supply and converts the CMOS or the TTL level voltage signal to the ECL level voltage signal.

What is claimed is:

1. A voltage output circuit responsive to an input signal and connected between a positive power supply and a negative power supply, comprising:
   a circuit output terminal;
   means for connecting said circuit output terminal to said negative power supply;
   a metal oxide semiconductor (MOS) transistor having a gate for receiving said input signal and a drain-source path, said drain-source path having a source end and a drain end, said drain end being connected to ground and having a current flow determined by said input signal;
   a bias circuit connected between said positive power supply and ground, and having a bias output terminal connected to said source end of said drain-source path of said MOS transistor, said bias circuit having a bias voltage at said bias output terminal set in accordance with said current flow of said MOS transistor; and
   means, including a first bipolar transistor having a collector, a base and an emitter, with said collector connected to said positive power supply, said base connected to said bias output terminal and said emitter connected to said circuit output terminal, for providing a circuit output voltage at said circuit output terminal in accordance with said bias voltage set by said bias circuit.

2. The voltage output circuit according to claim 1, wherein said bias circuit includes a first resistor and a second resistor connected in series and having a first node therebetween, said first and second resistors being connected in series between said positive power supply and ground, and wherein said bias output terminal comprises said first node between said first and second resistors.

3. The voltage output circuit according to claim 1, wherein said bias circuit comprises:
   a first resistor connected between said positive power supply and said base of said first bipolar transistor;
   second and third resistors connected in series with a second node therebetween, said second and third resistors connected between said base of said first bipolar transistor and ground; and
   a second bipolar transistor having a collector, a base and an emitter, said collector connected to said base of said first bipolar transistor, said base connected to said second node and said emitter connected to ground.

4. The voltage output circuit according to claim 1, further comprising:
   a plurality of third bipolar transistors having an associated current flow and connected to said first bipolar transistor in a Darlington configuration, whereby said associated current flowing through said plurality of third bipolar transistors is supplied to said circuit output terminal.

5. The voltage output circuit according to claim 3, further comprising:
   a plurality of third bipolar transistors having an associated current flow and connected in a Darlington configuration to said first bipolar transistor, whereby said associated current flowing through said plurality of third transistors is supplied to said circuit output terminal.

6. The voltage output circuit according to claim 2, wherein said first bipolar transistor has a base-emitter voltage and wherein said circuit output voltage at said circuit output terminal undergoes a transient shift between $$\frac{R14 \cdot V_{CC}}{R13 + R14} - V_{BE15} \text{ and } - V_{BE15}$$

where
   $V_{CC}$ is the voltage of said positive power supply,
   $R13$ and $R14$ are the resistive values of said first and second resistors, respectively, and
   $V_{BE15}$ is the base-emitter voltage, in accordance with said bias voltage.

7. The voltage output circuit according to claim 5, wherein said first and third bipolar transistor have base-emitter voltages associated therewith and wherein said circuit output voltage of said circuit output terminal undergoes a transient shift between $$\frac{(R1 + R2)V_{BE}}{R2} - V_{BEtotal} \text{ and } V_{BEtotal}$$

where
   $R1$ and $R2$ are the resistive values of said second and third resistors,
   $V_{BE}$ is the base-emitter voltage of said first bipolar transistor, and
   $V_{BEtotal}$ is the sum of base-emitter voltages of said plurality of third bipolar transistors.

* * * * *